United States Patent
He et al.

(10) Patent No.: US 8,427,877 B2
(45) Date of Patent: Apr. 23, 2013

(54) DIGITAL METHOD TO OBTAIN THE I-V CURVES OF NVM BITCELLS

(75) Inventors: Chen He, Austin, TX (US); Richard K. Eguchi, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 49 days.

(21) Appl. No.: 13/025,712

(22) Filed: Feb. 11, 2011

(65) Prior Publication Data

US 2012/0206973 A1    Aug. 16, 2012

(51) Int. Cl.
*G11C 16/06*    (2006.01)

(52) U.S. Cl.
USPC ............. 365/185.21; 365/185.22; 365/185.24

(58) Field of Classification Search ............. 365/185.21, 365/185.22, 185.24
See application file for complete search history.

(56) References Cited

U.S. PATENT DOCUMENTS

| | | | |
|---|---|---|---|
| 4,779,272 A | 10/1988 | Kohda et al. | |
| 5,757,816 A * | 5/1998 | Al-Assadi et al. | 714/718 |
| 5,956,277 A | 9/1999 | Roohparvar | |
| 6,226,200 B1 * | 5/2001 | Eguchi et al. | 365/185.19 |
| 6,269,022 B1 | 7/2001 | Ra | |
| 6,580,644 B1 | 6/2003 | Chung | |
| 6,684,173 B2 | 1/2004 | Kessenich et al. | |
| 7,046,555 B2 | 5/2006 | Lutze et al. | |
| 7,545,679 B1 | 6/2009 | Eguchi et al. | |
| 7,581,120 B1 * | 8/2009 | Hartman et al. | 713/300 |
| 7,649,782 B2 * | 1/2010 | Eguchi et al. | 365/185.22 |
| 7,729,165 B2 * | 6/2010 | Wang | 365/185.03 |
| 7,782,664 B2 * | 8/2010 | Gasquet et al. | 365/185.02 |
| 8,144,499 B2 * | 3/2012 | Kitagawa et al. | 365/148 |
| 8,169,156 B2 * | 5/2012 | Hsu et al. | 315/291 |
| 2008/0285351 A1 | 11/2008 | Shlick et al. | |
| 2009/0116290 A1 | 5/2009 | Yamada | |
| 2011/0267893 A1 * | 11/2011 | Kato et al. | 365/185.22 |

OTHER PUBLICATIONS

Extended European Search Report for EP Application No. 12154237.7 dated May 11, 2012.

* cited by examiner

*Primary Examiner* — Connie Yoha
(74) *Attorney, Agent, or Firm* — Hamilton & Terrile, LLP; Michael Rocco Cannatti

(57) ABSTRACT

A calibration table (160) of reference current (Iref) values and associated digital register settings is used during user test/diagnostics mode by varying the Iref values by changing the digital register settings and searching the transitioning gate voltage (Vg) of each bitcell at each Iref value to obtain the bitcell I-V curve using a digitally tunable gate voltage control (117) and reference current circuit (123) under control of a test module or circuit (110).

22 Claims, 4 Drawing Sheets

DIGITAL METHOD TO OBTAIN THE I-V CURVES OF NVM BITCELLS

BACKGROUND OF THE INVENTION

1. Field of the Invention

The present invention is directed in general to Non-Volatile Memories (NVM) and methods for operating same. In one aspect, the present invention relates to a method and apparatus for obtaining the current-voltage (I-V) curves of memory cells in Flash or electrically erasable programmable read only memories (EEPROM).

2. Description of the Related Art

Flash and electrically erasable, programmable, read-only memory (EEPROM) are types of non-volatile memory (NVM) used for non-volatile memory storage of information for data processing systems, such as microcontrollers, microprocessors, computers and other electronic devices (such as automotive embedded controllers) that store data that needs to be saved when power is removed from the device. EEPROM cells and Flash memory cells, can be characterized with a bitcell current-voltage (I-V) curve which plots the drain current conducted by the EEPROM cell based on the voltage applied to its word line (with the bit line set to a particular voltage). The NVM bitcell I-V curve is a useful diagnostic tool for failure analysis, investigating bitcell issues and potentially identifying imminent bitcell related failures. For instance, a bit having bad transconductance (Gm) can be determined with use of the I-V curve for the bitcell when the slope of the plotted I-V curve of the bitcell deviates from normal, so that it can be detected before it become failure in the field application. Moreover, bitcell I-V curves can help identify other type of potential issues like leaky bitcells, as well as determine short and open bitcells. Those issues are increasingly a concern as dimensions for NVM memory cells continue to shrink, thereby raising reliability and performance issues that can result in a failure condition of the NVM. Conventional diagnostic techniques for generating a bitcell current-voltage (I-V) curve for multiple bitcells use Parametric Measurement Unit (PMU) hardware to take multiple current measurements while sweeping the gate voltage, but these techniques are slow and require testing hardware (e.g., the PMU hardware or equivalent equipment) that is not readily available in most user application environment. In addition, the drain current output pin is typically not accessible at user mode with embedded NVM applications.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
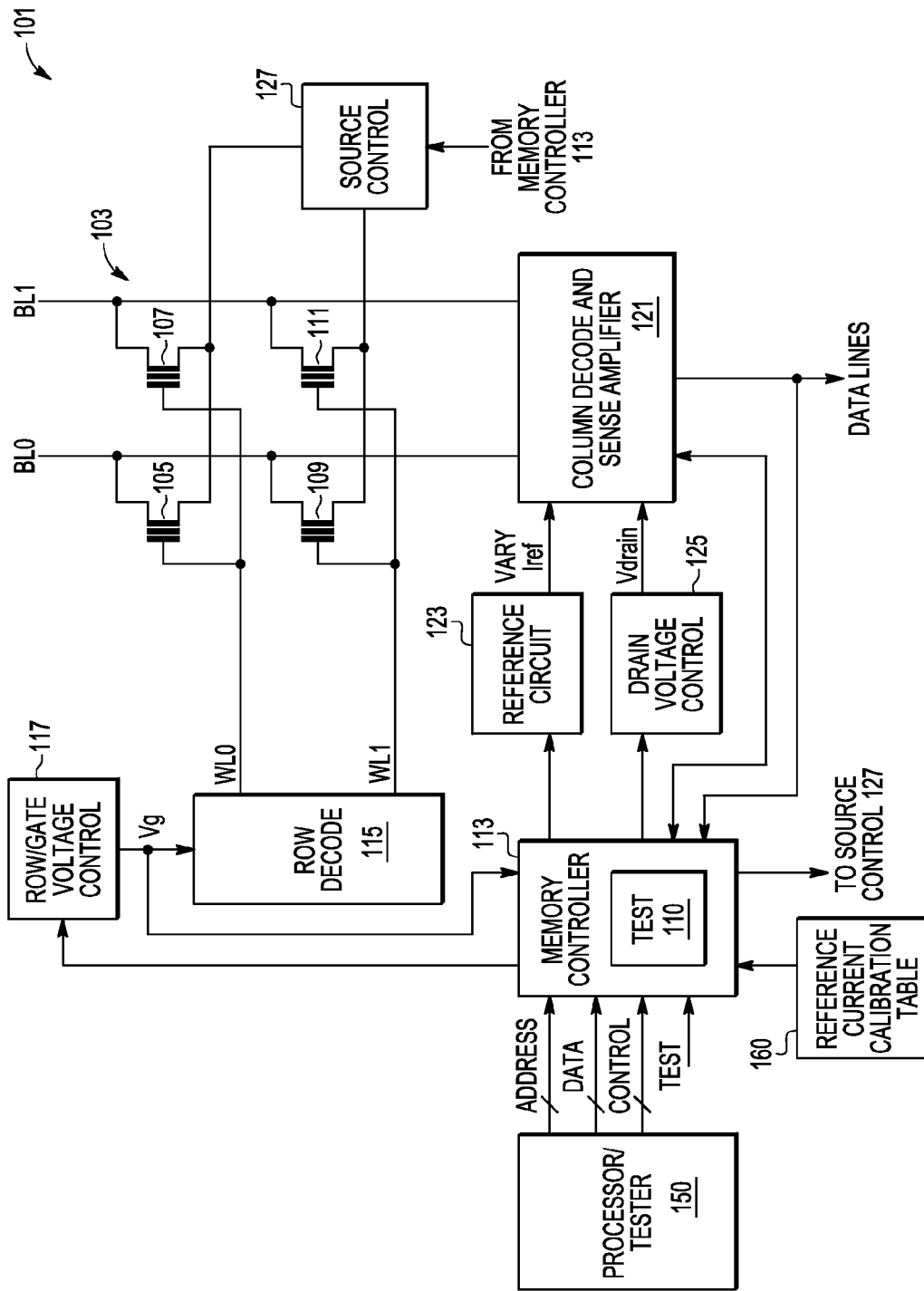
FIG. 1 is a block diagram of a NVM with diagnostic circuitry for generating bitcell I-V curve.

A method, system and apparatus are described for investigating bitcell issues and identifying imminent bitcell related failures by digitally generating bitcell I-V curves for flash memories by applying a digitally tunable reference current to a bitcell to determine the transitioning gate voltage at which the bitcell changes state (from non-conducting to conducting or vice versa), thereby deriving the bitcell I-V curve. In selected embodiments, a reference current calibration table is generated during production test flow wherein a plurality reference current (Iref) values are paired with a corresponding plurality of digital register settings and saved in non-volatile memory (e.g., test flash memory). While the reference current calibration table may store any desired number of reference current values, in selected embodiments, the number of reference current values (e.g., three reference current values) should be sufficient to generate a bitcell I-V curve or at least a representative approximation thereof During a user test diagnostics mode, the reference current calibration table is used to generate a bitcell I-V curve for one or more bitcells in a flash memory array. In particular, a user test module varies the reference current values applied to the bitcell array by stepping through the digital register values from the calibration table that are applied from a digitally trim-able reference current circuit. At each reference current value generated by the reference current circuit, a drain voltage control circuit applies the drain voltage to the bitcell and a plurality of digitally tunable gate voltages are sequentially applied to the bitcell and monitored to determine the transitioning gate voltage value at which the bitcell changes state, thereby generating the bitcell I-V curve. To this end, sense amplifier (SA) circuits may be used to sense the bitcell state by comparing to the resulting bitcell current Ids to the applied reference current from the digitally trim-able reference current circuit. In one example NVM technology, the SA output for a bitcell will be logic state "0" (non-conducting) when the bitcell drain current is less than the reference current, and will be logic state "1" (conducting) when the bitcell drain current is higher than the reference current. At each reference current setting, the gate voltage of the bitcell is swept from low to high voltages (or from high to low voltages), and the SA output of the bitcell is monitored to determine the transitioning gate voltage at which the bitcell transitions from one state (e.g., non-conducting or logic state "0") to the other state (e.g., conducting or logic state "1"). Once the transitioning gate voltage of the bitcell is determined, a point on the bitcell I-V curve is obtained with the current value (I) equal to the reference current, and the voltage value (V) equal to the transitioning gate voltage, and the process is repeated to obtain additional points on the bitcell I-V curve. As will be appreciated, the number of points that can be obtained for a given bitcell I-V curve is limited only by the number of reference current values stored in the calibration table, though as few as three points may provide sufficient information to convey relevant bitcell curve characteristics. It will also be appreciated that the bitcell curves can be generated for one or more bitcells in the NVM, though in selected embodiments, bitcell I-V curves may only need to be be generated for identified outlier bits by other conventional methods like threshold voltage distribution of the NVM bitcells. In any event, the generated bitcell I-V curves may be stored or transferred for subsequent processing and analysis.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Some portions of the detailed descriptions provided herein are presented in terms of algorithms and instructions that operate on data that is stored in a computer memory. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities. Unless specifically stated otherwise as apparent from the following discussion, it is appreciated that, throughout the description, discussions using terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Referring now to FIG. 1, there is depicted a schematic block diagram of a NVM 101 having includes an array 103 of NVM cells and diagnostic circuitry for generating bitcell I-V curves for determining whether any of the bitcells have a bad transconductance (gm) characteristics or become leaky or have other issues. In the depicted NVM array 103, four NVM cells 105, 107, 109, 111 are shown for illustrative purposes as being floating gate flash memory cells, but it will be appreciated that the array 103 may include additional bitcells and/or other types of NVM cells (e.g., nanocrystals, split gate flash, nitride based memories).

In the memory 101, a row/wordline or gate voltage control circuit 117 is provided for generating digitally tunable gate voltages (Vg) that are provided to the row decoder 115 and to the memory controller 113 (or other measurement circuit) so that the gate voltage Vg can be measured to user test mode. The row decoder 115 selectively provides the digitally tunable gate voltages Vg to the word lines WL0 and WL1 during memory operations. These words lines are connected to the gates of the memory cells of array 103. The memory 101 also includes a column decoder and sense amplifier (CD/SA) circuit 121 with sense amplifiers coupled to the bit lines BL0 and BL1 for reading the cells of array 103. During memory operations, a drain voltage control circuit 125 supplies a drain voltage (Vdrain) to the bit lines BL0 and BL1. In addition, a digitally trim-able reference current circuit or hardware unit 123 supplies a variable reference current (Iref) to a reference sense amplifier in the CD/SA circuit 121 for reading/sensing logic states of the bitcells 105, 107, 109, 111. In one example NVM technology, the SA output for a bitcell will be logic state 0 (non-conducting) when the bitcell drain current is less than the reference current, and will be logic state 1 (conducting) when the bitcell drain current is higher than the reference current. The CD/SA circuit 121 outputs the data read from the cells on data lines.

The memory controller 113 controls the memory operations of the array 103 during read, write, and test operations. To this end, the memory controller 113 is connected to the row/gate voltage control 117, reference circuit 123, drain voltage control 125, and source control 127 to control the voltage and current values provided by those circuits to the array 103 during memory and test operations. Memory controller 113 also provides control information to control the operations of row decode circuit 115 and CD/SA circuit 121 during memory and test operations. During such operations, the memory controller 113 includes address, data, and control lines for receiving address, data and control information from a processor or external tester 150. In one embodiment, processor 150 may be on the same integrated circuit or may be on a different integrated circuit In the embodiment shown, one of the control lines includes a test line for signaling the memory controller 113 to enter a user test mode that is controlled by a test module or circuit 110 to digitally obtain the I-V curve for flash array bitcells using the digitally tunable reference current and gate voltages and sense amplifiers. To enable the generation of the I-V curves, the memory controller 113 is connected to a reference current calibration table 160 containing a plurality of reference current values Iref and a corresponding plurality of digital register settings which are provided to the reference circuit 123 for generating a corresponding plurality of reference current values Iref. In selected embodiments, the calibration table 160 is populated during production with reference current values and associated digital register settings which may be saved in a non-volatile memory area (e.g., shadow or test flash). While the calibration table 160 may store any desired number of reference current values, in selected embodiments, there are at least three reference current values stored in the calibration table 160 which should be sufficient to generate a bitcell I-V curve or at least a representative approximation thereof.

When the test line input to the memory controller 113 signals a user test/diagnostics mode, the test circuit/module 110 causes the reference circuit 123 to effectively vary the reference current Iref by stepping through the digital register settings and searching the transitioning Vg of each bitcell at each Iref to obtain the bitcell I-V curve. In other words, with a selected reference current (Iref) provided to the column decode and sense amplifier circuit 121, the gate voltage control 117 supplies the bitcell under test with different Vg levels until the resulting bitcell current Ids causes the sense amplifier (SA) output of the bitcell to change state (e.g. from 0 to 1 if sweeping Vg from low to high voltages). When the gate voltage is swept, the source and drain voltages at the subject bitcell are predetermined or set. For example, the bitcell source is grounded by the source control 127, and the drain is set to 0.7V by the drain voltage control 124. To detect the transitioning gate voltage, the column decode and sense amplifier circuit 121 operates in a one address read (OAD) mode of one bit, using a sense amplifier to detect when the bitcell changes state. Each transitioning Vg level and associated selected reference current (Iref) value is a point on the bitcell I-V curve that may then be output on the data lines or otherwise stored under control of the test module or circuit 110 at the memory controller 113. The process is then repeated to generate additional points on the bitcell I-V curve by using the additional digital register settings from the calibration table 160 to provide the additional reference current (Iref) values to the column decode and sense amplifier circuit 121. For each additional selected reference current, Vg to the bitcell under test is swept again to determine the transitioning Vg at which the bitcell changes state, thereby generating another point on the bitcell I-V curve.

Figure 2:
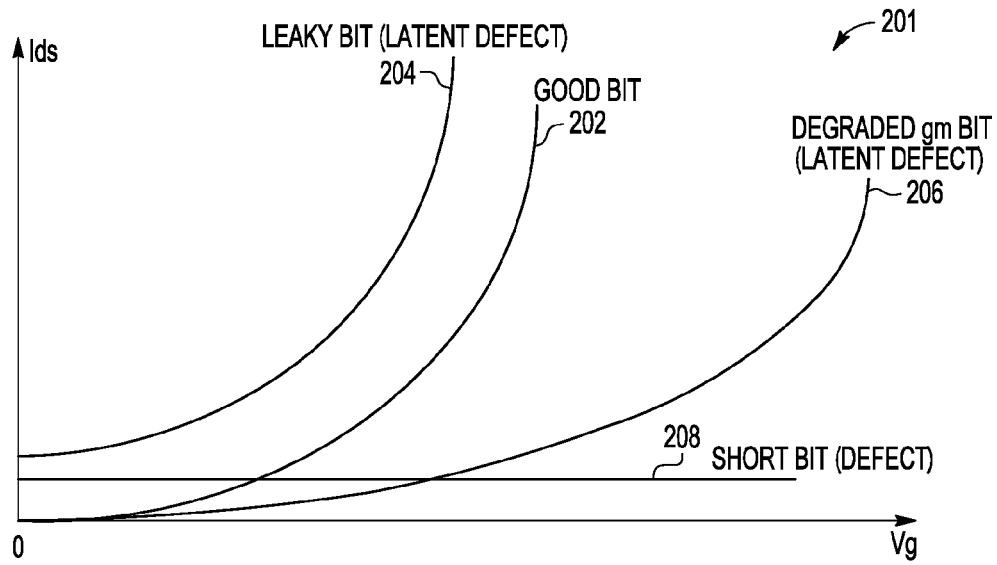
FIG. 2 is a graph illustrating bitcell I-V curves for example bitcells.

FIG. 2 is a graphical illustration 201 of selected bitcell I-V curves which are provided to illustrate the use of bitcell I-V curves to determine good and defective bitcells. The X axis represents the wordline or gate voltage (Vg) that is applied to a word line of a bit cell during a read operation, while the Y axis represents the drain current (Idrain) (bit line current) of a bit cell during a memory read operation. Plotline 202 depicts the current-voltage (I-V) curve for a normal or good bit cell, where the slope of these curve is the transconductance (gm) of the cell. Plotline 204 depicts the I-V curve for a leaky bitcell with normal transconductance like 202 but non-zero drain current at zero Vg which may indicate the presence of a latent defect. Such leaky bit may result in excessive column leakage and drag down the drain voltage during a program operation and hence possibly cause a program operation to fail. In addition, plotline 206 depicts the I-V curve for a bitcell with a degraded transconductance (gm) having a slope that is less than that for a normal curve 202 and may indicate the presence of a latent defect. A bitcell with degraded transconductance (gm) may become slow to erase or slow to program bits and eventually may cause an erase or program operation to fail. Finally, plotline 208 shows the I-V curve for a short bitcell which has a constant drain current no matter what the Vg is, which indicates a defect in the bitcell such as bitline to ground short.

As will be appreciated, a bitcell I-V curve with abnormal transconductance or non-zero current at zero Vg or other abnormality may be indicative of a manufacture defect in the cell. In addition, the NVM cell may degrade over time due to electrical stress on the cell. Thus, a cell which may provide acceptable test results during manufacture testing may fail over time due to such stress. Accordingly, it is desirable to determine whether a cell has any abnormality in its bitcell I-V curve in the field or during user test mode, even if such a cell passes tests during production test.

Figure 3:
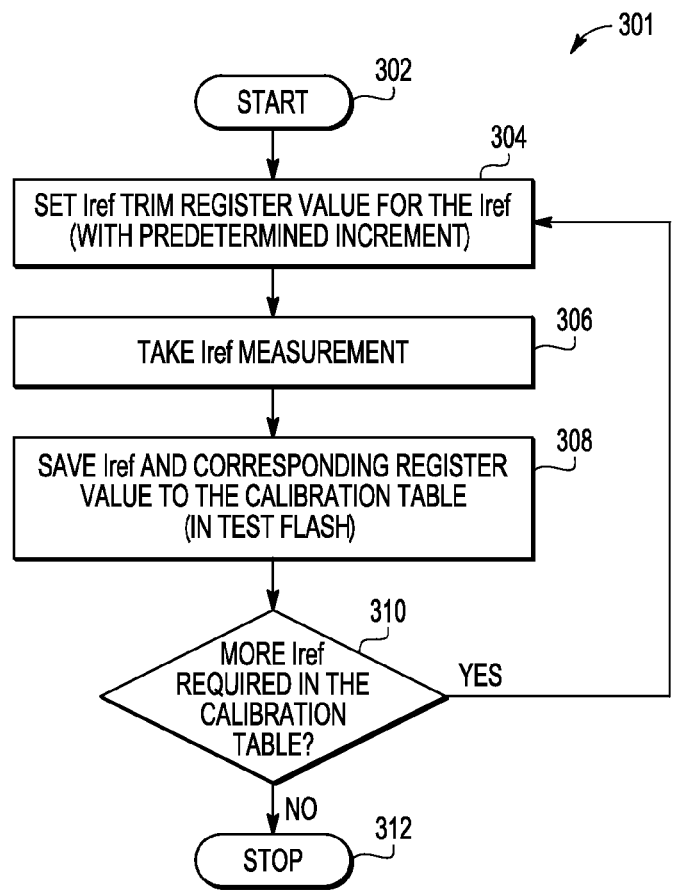
FIG. 3 is a simplified schematic flow chart illustrating a method for generating a calibration table of the reference current and associated digital register settings during production test flow.

Reference is now made to FIG. 3 which shows a simplified schematic flow chart illustrating a method 301 for generating a calibration table of the reference current and associated digital register settings during production test flow. In the depicted methodology, the process begins at step 302 by setting a first digital register value for a digitally trim-able reference current circuit (step 304) and then measuring the resulting reference current (Iref) generated by the reference current circuit (step 306). The measured reference current (Iref) and corresponding first digital register value are then saved to a first entry in the calibration table (step 308) stored in test flash memory. By pairing or associating the measured reference current (Iref) and corresponding first digital register value, the calibration table may be accessed to retrieve and use the first digital register value to generate a corresponding reference current, and also to retrieve the measured reference current (Iref) for purposes of defining a point on an I-V curve as described more fully herein. If additional reference current values are to be calibrated (affirmative outcome to decision block 310), the process returns to set the digital register value for a digitally trim-able reference current circuit (step 304) using a suitable or predetermined increment. Once the required reference current values are calibrated (negative outcome to decision block 310), the process is completed with the calibration table stored to memory (step 312).

Figure 4:
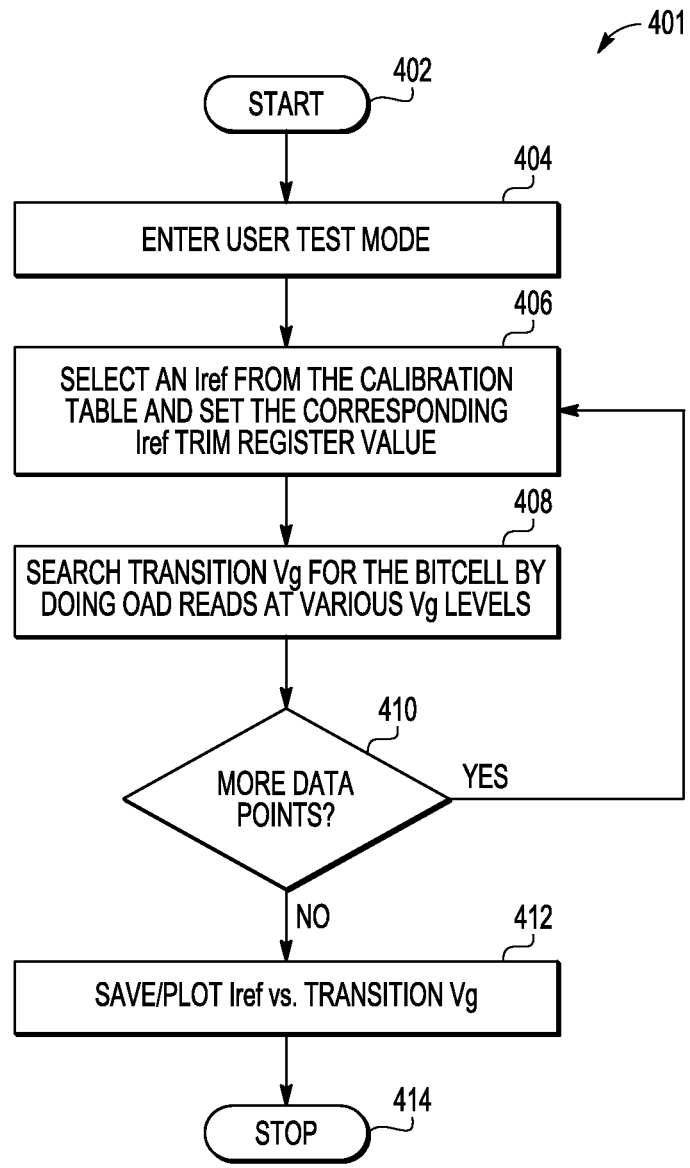
FIG. 4 is a simplified schematic flow chart illustrating a method for generating a bitcell I-V curve during user test mode.

FIG. 4 is a simplified schematic flow chart illustrating a method 401 for generating a bitcell transconductance curve during user test mode. In the depicted methodology, the process begins at operation 402. At operation 404, the memory enters a diagnostic user test mode at operation 404. In selected embodiments, a diagnostic mode is entered when memory controller 113 receives a signal on the test line to enter the diagnostic mode. In other embodiments, memory enters a diagnostic mode when it receives commands from a processor (e.g. 150) or external tester.

In operation 406, a reference current value is selected from the calibration table and the corresponding reference current trim register value is set. In selected embodiments, the test module or circuit 110 or controller 113 sets the reference current trim register value so that the reference circuit 123 generates the corresponding reference current (Iref). In addition, the row/gate control circuit 117 is set to provide a first word line/gate voltage (e.g., 0V) for the bitcell under test, the drain voltage control circuit 125 is set to provide the appropriate drain voltage for the bitcell under test, and the source voltage control circuit 127 is set to provide the appropriate source voltage for the bitcell under test. In this configuration, the bitcell under test produces a particular drain current in response to the first word line voltage and the sense amplifier compares the bitcell drain current against the reference current to determine the bitcell state.

In operation 408, the test module or circuit 110 or controller 113 determines if the first word line/gate voltage is the gate voltage Vg which generates a drain current causing the bitcell to change state (from non-conducting to conducting or vice versa). In selected embodiments, sense amplifier (SA) circuitry in the circuit 121 determines when the bitcell changes state. Assuming the Vg is increasing from low (e.g. 0 v) to high voltage (e.g. 9V), the transitioning Vg of the bitcell is at which the SA output of the bitcell changes from 0 to 1. On the other hand, assuming the Vg is decreasing from high (e.g. 9 v) to low voltage (e.g. 0V), the transitioning Vg of the bitcell is at which the SA output of the bitcell changes from 1 to 0. If the drain current does not cause the bitcell to change state, a second word line/gate voltage is provided to the bitcell under test, and the process is repeated to search for a gate voltage Vg for the bitcell which causes the SA output of the bitcell to change state. In selected embodiments, the digitally tunable row/gate control circuit 117 is set to provide a plurality of word line/gate voltages by stepping or sweeping through a sequence of increasing (or decreasing) gate voltages until a transition point is detected when the drain current matches the reference current. In selected embodiments, the search is performed by performing one address read (OAD) operations at various word line/gate voltage levels until a bitcell state transition is found. The functionality represented by the test module or circuit 110 may be implemented as a state machine, firmware or software that is tangibly embodied in a computer readable, non-transitory storage medium.

Once a transitioning gate voltage Vg is obtained, a data point on the I-V curve is defined as the selected reference current (Iref) and the corresponding gate voltage (Vg) which generated the transitioning drain current. If additional data points for the bitcell I-V curve are required (affirmative outcome to decision operation 410), the process is repeated by selecting another reference current form the calibration table (operation 406) and searching for the matching gate voltage (operation 408). As will be appreciated, the number of data points that can be obtained for a given bitcell I-V curve is limited only by the number of reference current values stored in the calibration table, though as few as three points or up to ten or more points may provide sufficient information to convey relevant bitcell curve characteristics. Depending on the desired implementation, some or all of the reference current values in the calibration table may be used to generate data points.

If no additional data points are required for the bitcell I-V curve (negative outcome to decision operation 410), the acquired data points are saved or plotted at operation 412, and the process ends at operation 414. For example, memory controller 113 may include registers for storing the acquired I-V curve datapoints. In selected embodiments, the memory controller is controlled by processor 150 via the control lines for performing the operations of FIG. 4. Alternatively, the memory 101 may be coupled to a tester during testing for controlling memory controller 113 during testing. Thus, the evaluation or analysis of the I-V curve data points may be performed using post processing tools such as known in the art to determine if a bitcell has bad or impaired transconductance or is otherwise deemed defective. In selected embodiments, the integrated circuit including the memory circuit is discarded, while in other embodiments, the cell or cells with defective transconductance may be identified and replaced with redundant memory cells of the circuit. In still other embodiments, cells that are defective may be marked as unusable for storage. In other embodiments, the collected I-V curve data points are post-processed to determine whether the curve looks "normal." An example process would be to calculate the slope of the curve (aka, transconductance or Gm) to see if there is some initial offset if any. If a defective bitcell is found at the user side, the user can be notified to stop using it in their application to avoid a catatrosphic failure in field application. For example, the check engine/maintenance light may be turned on if an abnormal Ids is found. Another case would be for the application to undertake predetermined risk mitigation actions. If a defective bitcell is found during factory test, a physical analysis may be performed to determine the root cause of the defect and feed the information back to the fab to improve the manufacturing process.

Figure 5:
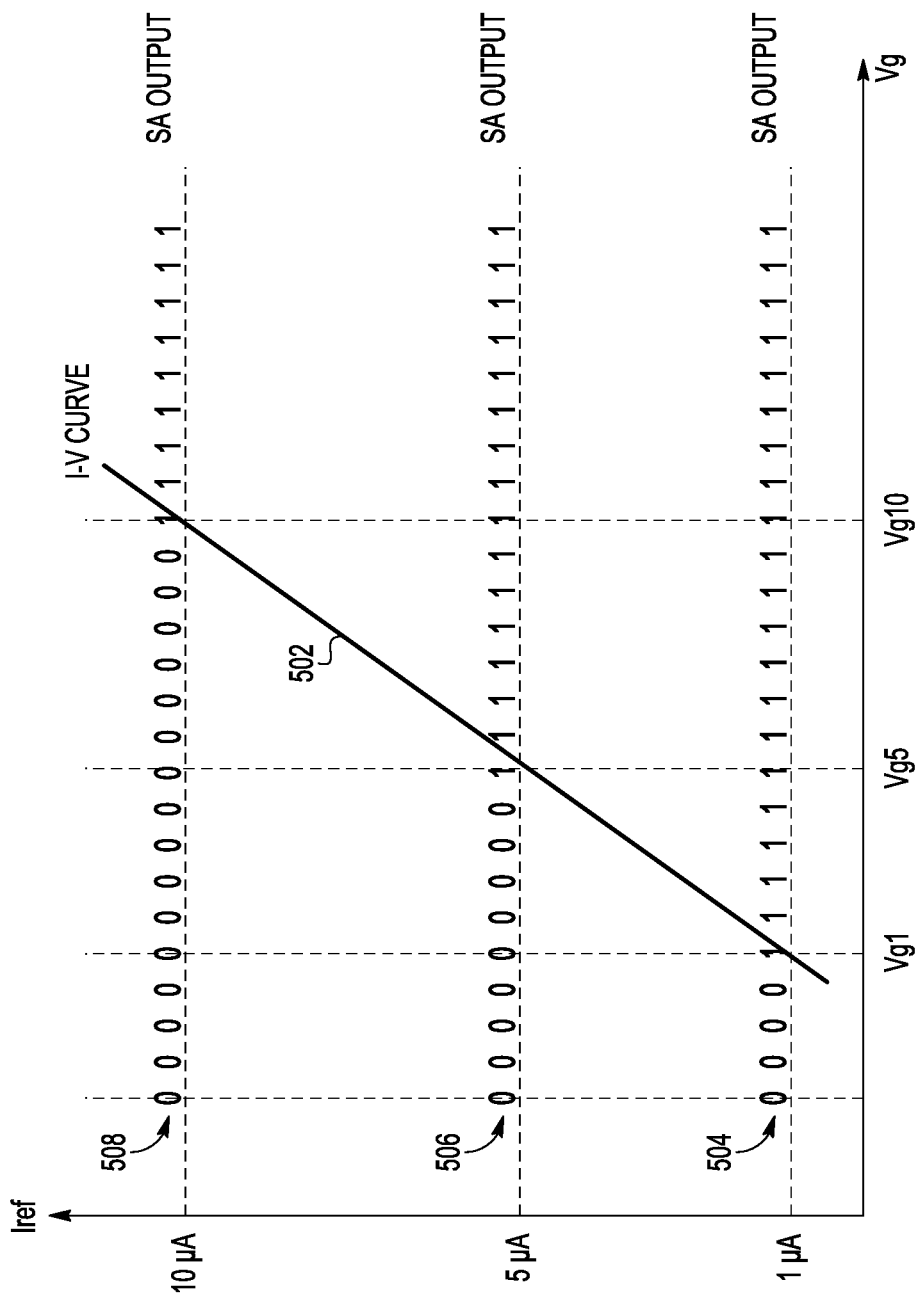
FIG. 5 is a current-voltage curve showing a sense amplifier output for the bitcell being tested at each Vg and each reference.

To provide an illustration of an example search process that may be used for steps 406 and 408, reference is now made to FIG. 5 which depicts a current-voltage curve 502 showing a sense amplifier output for the bitcell being tested at each Vg and each reference. As depicted, the zeros and ones in row 504 show the output of a sense amplifier (SA) for the bitcell being tested at each Vg when the reference current (Iref) is 1 uA, where the SA output for the bitcell will be 0 when the bitcell drain current is less than the reference current, and will be 1 when the bitcell drain current is higher than the reference current. Likewise, row 506 shows the zero and one SA outputs at the swept Vg levels when Iref equals 5 uA, and row 508 shows the zero and one SA outputs at the swept Vg levels when Iref equals 10 uA. In the depicted example, Vg1, Vg5 and Vg10 are the Vg transition values at 1 uA, 5 uA and 10 uA of Iref, respectively, which define three data points in the bitcell IV curve.

By now it should be appreciated that there is provided herein a method and apparatus for generating current-voltage characteristic information for a non-volatile memory bitcell. In the disclosed methodology, a calibration table is obtained or provided that includes reference current values and a corresponding plurality of digital register settings. The calibration table may be retrieved from test flash memory where it is stored after being generated by setting a digital register for a digitally trim-able reference current circuit to one of a plurality of values, measuring the reference current generated by the digitally trim-able reference current circuit at each of the plurality of values, and saving the measured reference current and associated digital register value as a value pair in the calibration table. Once the calibration table is obtained, a selected reference current is generated that corresponds to a selected digital register setting from the calibration table, such as by applying the selected digital register setting from the calibration table to a digitally trim-able reference current circuit to generate the selected reference current. Thereafter, the selected reference current is compared to a drain current generated by a non-volatile memory bitcell as one or more sweeping gate voltages are applied to the non-volatile memory bitcell until a matching or "transitioning" gate voltage is identified that generates a drain current that matches the selected reference current. The comparison may be performed by applying the selected reference current and the drain current to a sense amplifier circuit to perform one address reads of the non-volatile memory bitcell at a plurality of gate voltages. To generate additional current-voltage characteristic information, a different digital register setting may be selected from the calibration table and used to generate a second reference current corresponding to the different digital register setting that is compared to a drain current generated by the non-volatile memory bitcell as one or more gate voltages are applied to the non-volatile memory bitcell until a second matching or "transitioning" gate voltage is identified that generates a drain current that matches the second reference current. For example, the sweeping gate voltage may be applied to the non-volatile memory bitcell by increasing the gate voltage from low to high (or high to low) until the resulted bitcell drain current becomes higher (or lower) than the reference current so that the sense amplifier output of the bitcell changes logic states from 0 to 1 (or 1 to 0). Finally, each matching gate voltage and selected reference current may be stored as current-voltage characteristic information, such as a point on a current-voltage curve, for the non-volatile memory bitcell.

In another form, there is provided a non-volatile memory device and method for testing same. As disclosed, the memory device includes a plurality of non-volatile memory bitcells arranged in an array of rows and columns. For example, with a plurality of non-volatile semiconductor memory transistors arranged in rows and columns, each memory transistor includes a source, a drain, and a floating gate that is injectable with electrons and being dischargeable, wherein gates of all transistors in each row of semiconductor memory transistors are connected to a corresponding word line, wherein drains of all transistors in each column are connected to a corresponding bit line, and wherein sources of all transistors in each row are connected to a corresponding source control line. The memory device also includes a calibration table memory stored in non-volatile test flash memory that stores digital register settings corresponding to a plurality of reference current values. In addition, a digitally tunable reference current generator circuit generates a selected reference current corresponding to a selected digital register setting from the calibration table memory, and a column decoder applies the selected reference current to a selected non-volatile memory bitcell in the array. The memory device also includes a gate voltage generator circuit for generating a plurality of sweeping gate voltages, and a row decoder for applying the plurality of sweeping gate voltages to the selected non-volatile memory bitcell. Finally, a sense amplifier circuit compares the selected reference current to a drain current generated by the selected non-volatile memory bitcell as the plurality of sweeping gate voltages are applied to the selected non-volatile memory bitcell until a transitioning gate voltage is identified. In operation and design, the sense amplifier circuit outputs a first logic state when the drain current generated by the selected non-volatile memory bitcell is less than the selected reference current, and outputs a second logic state when the drain current generated by the selected non-volatile memory bitcell is higher than the reference current. In selected embodiments, the memory device includes a memory for storing a plurality of current-voltage value pairs comprising a first selected reference current value and a corresponding first transitioning gate voltage, and in other embodiments, the memory device includes one or more data output ports for outputting a plurality of current-voltage value pairs comprising a first selected reference current value and a corresponding first transitioning gate voltage.

In yet another form, there is provided a method and apparatus for obtaining current-voltage curve data points for one or more non-volatile memory bitcells. In the disclosed methodology, a predetermined reference current is generated that corresponds to a digital value stored in a calibration table. In selected embodiments, the calibration table is generated setting a digital register setting for a digitally trim-able reference current circuit to a first digital value, measuring a reference current generated by the digitally trim-able reference current circuit, and saving the measured reference current and first digital value as a value pair in the calibration table. In this way, the predetermined reference current may be generated by obtaining a calibration table having a plurality of predetermined reference current values and a corresponding plurality of digital values, selecting a first digital value from the calibration table, and generating the predetermined reference current corresponding to the selected first digital value. As predetermined source and drain voltages are applied to a selected non-volatile memory bitcell, a sweeping gate voltage is applied to the selected non-volatile memory bitcell, and the predetermined reference current is compared to a drain current generated by the selected non-volatile memory bitcell as the sweeping gate voltage is applied to the selected non-volatile memory bitcell until a transitioning gate voltage is identified. When a transitioning gate voltage is identified, a current-voltage curve data point is output that includes a first value corresponding to the predetermined reference current and a second value corresponding to the transitioning gate voltage. By applying a plurality of predetermined reference currents to the sense amp while sweeping gate voltages are applied, a plurality of transitioning gate voltage and reference current values are generated to provide current-voltage characteristic information for the selected non-volatile memory bitcell, thereby defining a plurality of current-voltage curve points for the selected non-volatile memory bitcell. Over time, these current-voltage curve points for the selected non-volatile memory bitcell are processed (e.g., over different time intervals and/or out in the field) to determine if the selected non-volatile memory bitcell a bitcell has bad or impaired transconductance or is otherwise defective.

Although the described exemplary embodiments disclosed herein are directed to a method and apparatus for digitally obtaining I-V curves from non-volatile bitcells, the present invention is not necessarily limited to the example embodiments which illustrate inventive aspects of the present invention that are applicable to a wide variety of memory test schemes. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for generating current-voltage characteristic information for a non-volatile memory bitcell, comprising:
   generating a selected reference current corresponding to a selected digital register setting;
   comparing the selected reference current to a drain current generated by a non-volatile memory bitcell as a sweeping gate voltage is applied to the non-volatile memory bitcell until a transitioning gate voltage is identified; and
   storing the transitioning gate voltage and selected reference current as current-voltage characteristic information for the non-volatile memory bitcell.

2. The method of claim 1, further comprising obtaining a calibration table from test flash memory comprising a plurality of reference current values and a corresponding plurality of digital register settings.

3. The method of claim 2, where obtaining the calibration table comprises:
   setting a digital register setting for a digitally trim-able reference current circuit to a first value;
   measuring a reference current generated by the digitally trim-able reference current circuit; and
   saving the measured reference current and first value as a value pair in the calibration table.

4. The method of claim 1, where generating the selected reference current comprises applying the selected digital register setting to a digitally trim-able reference current circuit to generate the selected reference current.

5. The method of claim 1, where comparing the selected reference current to a drain current of the non-volatile memory bitcell comprises applying the selected reference current and the drain current of the non-volatile memory bitcell to a sense amplifier circuit.

6. The method of claim 1, where comparing the selected reference current to a drain current of the non-volatile memory bitcell comprises performing one address reads of the non-volatile memory bitcell at a plurality of gate voltages.

7. The method of claim 1, where the sweeping gate voltage is applied to the non-volatile memory bitcell by increasing the gate voltage from low to high until the drain current generated by the non-volatile memory bitcell is larger than the selected reference current so that a sense amplifier output of the bitcell changes from logic 0 to 1.

8. The method of claim 1, where the sweeping gate voltage is applied to the non-volatile memory bitcell by decreasing the gate voltage from high to low until the drain current generated by the non-volatile memory bitcell is smaller than the selected reference current so that a sense amplifier output of the bitcell changes from logic 1 to 0.

9. The method of claim 1, further comprising:
generating a second reference current corresponding to a different digital register setting;
comparing the second reference current to a drain current generated by a non-volatile memory bitcell as a sweeping gate voltage is applied to the non-volatile memory bitcell until a second transitioning gate voltage is identified; and
storing the second transitioning gate voltage and second reference current as current-voltage characteristic information for the non-volatile memory bitcell, thereby defining a plurality of current-voltage curve points for the non-volatile memory bitcell.

10. The method of claim 1, where storing the transitioning gate voltage and selected reference current comprises storing the transitioning gate voltage and selected reference current as a point on a current-voltage curve for the non-volatile memory bitcell.

11. A memory device, comprising:
a plurality of non-volatile memory bitcells arranged in an array of rows and columns;
a calibration table memory storing a plurality of digital register settings corresponding to a plurality of reference current values;
a reference current generator circuit for generating a selected reference current corresponding to a selected digital register setting from the calibration table memory;
a gate voltage generator circuit for generating a plurality of sweeping gate voltages;
a row decoder for applying the plurality of sweeping gate voltages to the selected non-volatile memory bitcell; and
a sense amplifier circuit for comparing the selected reference current to a drain current generated by the selected non-volatile memory bitcell as the plurality of sweeping gate voltages are applied to the selected non-volatile memory bitcell until a transitioning gate voltage is identified.

12. The memory device of claim 11, further comprising a memory for storing a plurality of current-voltage value pairs comprising a first selected reference current value and a corresponding first transitioning gate voltage.

13. The memory device of claim 11, further comprising one or more data output ports for outputting a plurality of current-voltage value pairs comprising a first selected reference current value and a corresponding first transitioning gate voltage.

14. The memory device of claim 11, where the plurality of non-volatile memory bitcells comprises a plurality of non-volatile semiconductor memory transistors arranged in rows and columns, each said memory transistor comprising a source, a drain, and a gate, said gate being a floating gate injectable with electrons and being dischargeable, wherein gates of all transistors in each row of semiconductor memory transistors are connected to a corresponding word line, wherein drains of all transistors in each column are connected to a corresponding bit line, and wherein sources of all transistors in each row are connected to a corresponding source control line.

15. The memory device of claim 11, where the calibration table memory comprises a non-volatile test flash memory.

16. The memory device of claim 11, where the reference current generator circuit comprises a digitally tunable reference current circuit.

17. The memory device of claim 11, where the sense amplifier circuit outputs a first logic state when the drain current generated by the selected non-volatile memory bitcell is less than the selected reference current, and outputs a second logic state when the drain current generated by the selected non-volatile memory bitcell is higher than the reference current.

18. A method for obtaining current-voltage curve data points for one or more non-volatile memory bitcells, comprising:
generating a predetermined reference current;
applying predetermined source and drain voltages to a selected non-volatile memory bitcell;
applying a sweeping gate voltage to the selected non-volatile memory bitcell;
comparing the predetermined reference current to a drain current generated by the selected non-volatile memory bitcell as the sweeping gate voltage is applied to the selected non-volatile memory bitcell until a transitioning gate voltage is identified; and
outputting a current-voltage curve data point comprising a first value corresponding to the predetermined reference current and a second value corresponding to the transitioning gate voltage.

19. The method of claim 18, where generating a predetermined reference current comprises:
obtaining a calibration table comprising a plurality of predetermined reference current values and a corresponding plurality of digital values;
selecting a first digital value from the calibration table; and
generating the predetermined reference current corresponding to the selected first digital value.

20. The method of claim 18, further comprising:
generating a second predetermined reference current;
applying predetermined source and drain voltages to a selected non-volatile memory bitcell;
applying a sweeping gate voltage to the selected non-volatile memory bitcell;
comparing the second predetermined reference current to a drain current generated by the selected non-volatile memory bitcell as the sweeping gate voltage is applied to the selected non-volatile memory bitcell until a second transitioning gate voltage is identified; and
storing the second transitioning gate voltage and second predetermined reference current as current-voltage characteristic information for the selected non-volatile memory bitcell, thereby defining a plurality of current-voltage curve points for the selected non-volatile memory bitcell.

21. The method of claim 20, further comprising processing the plurality of current-voltage curve points for the selected non-volatile memory bitcell over time to determine if the selected non-volatile memory bitcell a bitcell has bad or impaired transconductance or is otherwise defective.

22. The method of claim 18, further comprising generating the calibration table by:
setting a digital register setting for a digitally trim-able reference current circuit to a first digital value;
measuring a reference current generated by the digitally trim-able reference current circuit; and
saving the measured reference current and first digital value as a value pair in the calibration table.

* * * * *

UNITED STATES PATENT AND TRADEMARK OFFICE
CERTIFICATE OF CORRECTION

PATENT NO. : 8,427,877 B2  
APPLICATION NO. : 13/025712  
DATED : April 23, 2013  
INVENTOR(S) : Chen He and Richard K. Eguchi Page 1 of 1

It is certified that error appears in the above-identified patent and that said Letters Patent is hereby corrected as shown below:

In the Claims

Column 12, Claim 21, line 55 should read: "selected non-volatile memory bitcell has bad or"

Signed and Sealed this  
Eleventh Day of June, 2013

Teresa Stanek Rea  
*Acting Director of the United States Patent and Trademark Office*